(12) United States Patent
Jones

(10) Patent No.: US 6,349,150 B1
(45) Date of Patent: Feb. 19, 2002

(54) PREDICTIVE DATA COMPRESSION SYSTEM AND METHODS

(75) Inventor: Larry D. Jones, Louisville, CO (US)

(73) Assignee: Storage Technology Corporation

(*) Notice: Subject to any disclaimer, the term of this patent is extended or adjusted under 35 U.S.C. 154(b) by 0 days.

(21) Appl. No.: 09/243,293

(22) Filed: Feb. 2, 1999

(51) Int. Cl.[7] .................................................. G06K 9/36
(52) U.S. Cl. ..................... 382/238; 382/232; 382/243
(58) Field of Search ................................ 328/238, 232, 328/243; 345/419

(56) References Cited

U.S. PATENT DOCUMENTS

| | | | |
|---|---|---|---|
| 5,247,638 A | 9/1993 | O'Brien et al. | 395/425 |
| 5,357,614 A | 10/1994 | Pattisam et al. | 395/250 |
| 5,561,824 A | 10/1996 | Carreiro et al. | 395/872 |
| 5,602,764 A | 2/1997 | Eskandari-Gharnin et al. | 364/715.09 |
| 5,805,932 A | 9/1998 | Kawashima et al. | 395/888 |

FOREIGN PATENT DOCUMENTS

JP     04 086126 A     3/1992     ............ H03M/7/30

*Primary Examiner*—Jose L. Couso
*Assistant Examiner*—Anh Hong Do
(74) *Attorney, Agent, or Firm*—Duft, Graziano & Forest; Wayne P. Bailey

(57) ABSTRACT

Data compression logic of the invention compresses data from a host to a connected cache memory for storage within a storage device. A compressor within the logic implements a compression algorithm on the data; and a plurality of Chunk RAMs store compressed and uncompressed data chunks from the compressor. Predictive digital logic assesses memory usage within the RAMS while uncompressed and compressed chunks are stored within the RAMs. The predictive digital logic selects one RAM to drain its data into the cache memory based upon the compression efficiency of the compressed data as compared to the uncompressed data and prior to the complete loading of the chunks within the RAMs, resulting in reduced latency in writing compressed data to the connected cache memory. The predictive digital logic can include calculation logic for dynamically calculating compression efficiency, used in selecting which RAM to drain.

14 Claims, 3 Drawing Sheets

PREDICTIVE DATA COMPRESSION SYSTEM AND METHODS

FIELD OF THE INVENTION

The invention relates to data storage, data retrieval from storage devices, and data compression. The invention more particularly relates to reducing latency associated with data compression through predictive data compression.

BACKGROUND OF THE INVENTION

Many storage devices and systems utilize data compression to increase virtual storage capacity. The prior art is familiar with Advanced Data Compression products which accompany such storage devices, including Direct Access Storage Devices (DASD) and tape systems.

These products utilize compression algorithms which provide compression ratios of up to 5:1 but which also create data transfer latency: the time it takes for a given byte of data to enter the compression logic until the corresponding compressed data is available for writing to the storage device. A typical latency of the first byte of data through a prior art compression product on a 20 M-byte per second ESCON channel is approximately twenty six microseconds (ESCON defines IBM's fiber interface, as known in the art).

The major cause of above-described latency is attributed to the way in which prior art Advanced Data Compression logic processes data which can expand or compress. Specifically, if compressed data expands rather than compresses, uncompressed data is stored instead. FIG. 1 schematically illustrates prior art Advanced Data Compression logic 8.

In FIG. 1, the host processor 10 transmits data for compression to the compressor 12 on a data link 14, such as a serial fiber optic link defined by IBM's ESCON interface. This data is divided into 512-byte blocks, or "chunks" of data. The compressor 12 compresses the first block and writes that compressed block onto data bus 16 and into "Chunk RAM 2," corresponding to a first random access memory or FIFO within logic 8. An uncompressed version of the same data chunk is also written into "Chunk RAM 0," corresponding to a second random access memory or FIFO within logic 8. After the chunk data is written into both the compressed and uncompressed chunk RAMs, i.e., Chunk RAM 2 and Chunk RAM 0, respectively, the number of bytes in these memory locations are compared by compression logic 8 and the one with the fewest number of bytes is selected and sent to the associated storage device 18.

If, for example, the chunk data within Chunk RAM 2 has the fewest number of bytes, that data is routed to device 18 along bus 20, through multiplexer 22, and onto a slower 12.5 M-byte per second data path 24. While the data from Chunk RAM 2 is being sent to device 18, Chunk RAM 0 and Chunk RAM 1 (a third random access memory or FIFO within logic 8) are allocated to receive the next 512-byte data chunks of uncompressed and compressed data, respectively, from the host 10. When Chunk RAMs 0 and 1 are filled, one of the following two scenarios can occur:

(1) If Chunk RAM 2 has had time to empty, Chunk RAM 0 or 1 (whichever has fewer bytes) will be selected, as above, and its data will begin transferring to device 18. The remaining two Chunk RAMs are then reallocated to receive more data from the host 10;

(2) If Chunk RAM 2 has not had sufficient time to empty, Chunk RAMs 0 and 1 will hold their data and no more data can be taken from the host 10. Eventually, when Chunk RAM 2 empties, the sequence of scenario (1) is followed.

This process of allocating two 512-byte chunks of data into Chunk RAMs as compressed and uncompressed versions, and then comparing and selecting the version for storage into device 18, sequentially repeats through successive data chunks for the entire data transfer from the host 10. Data transfer latency continues to occur because all 512-bytes of chunk data must be received in order to determine which version (compressed or uncompressed) of the chunk data should be transferred to storage device 18. The latency actually increases the likelihood that scenario (2) will occur. Furthermore, in that most systems incorporating logic 8 provide a host-side data rate on path 14 that is faster than the device-side data rate on path 24, scenario (2) is even more likely. By way of example, certain prior art systems have a host-side data rate of 20 M-bytes per second and a device-side data rate of 12.5 M-bytes per second.

Data compression systems would thus benefit from systems and methods which reduce data compression latency such as described above; and one object of the invention is to provide such systems and methods.

Another object of the invention is to provide an application specific integrated circuit (ASIC) which provides improvements to Advanced Data Compression logic to reduce data compression latency.

Yet another object of the invention is to provide a data compression system with predictive data compression to reduce data compression latency.

These and other objects will become apparent in the description that follows.

SUMMARY OF THE INVENTION

U.S. Pat. Nos. 5,602,764 and 5,247,638 relate to data compression for storage devices and provide useful background information for the invention. U.S. Pat. Nos. 5,602,764 and 5,247,638 are thus herein incorporated by reference.

In one aspect, the invention provides data compression logic to compress data from a host to a connected storage device. A compressor implements a compression algorithm on the data, and memory stores compressed and uncompressed data chunks from the compressor. Predictive digital logic assesses memory usage within the memory while uncompressed and compressed chunks are stored within the memory. The predictive digital logic drains either the uncompressed chunks or compressed chunks into the storage device based upon compression efficiency of the compressed data as compared to the uncompressed data and prior to complete loading of the chunks within the memory.

In one aspect, the memory includes Chunk RAMs, one RAM storing the compressed data chunks and one RAM storing the uncompressed data chunks. Preferably, the Chunk RAMs include three chunk RAMs, two RAMs for storing data chunks while a third RAM drains into the storage device.

In another aspect, a multiplexer routes selected chunk data from one of the RAMs to the storage device.

In still another aspect, the predictive digital logic includes calculation logic to dynamically calculate compression efficiency in selecting one RAM for draining. The calculation logic can dynamically calculate and compare compression efficiency as a linear function, for example.

In another aspect, the invention provides a data compression system to compress data from a host to a cache memory. A bus interface communicates with a host bus connected to the host; and a DMA controller reformats the data into data chunks. Compressor logic compresses the reformatted data and stores and selects compressed or uncompressed data chunks for transfer to the cache memory. The compressor logic has predictive digital logic to compare the uncompressed and compressed data chunks and to select either the uncompressed or compressed data chunk to drain into the cache memory based upon compression efficiency of the compressed data chunk as compared to the uncompressed data chunk.

In one aspect, a FIFO is used as a buffer to store reformatted data prior to compression by the compressor.

The invention also provides a method of predicting data compression for early draining of a data buffer within compression logic, the logic of the type which compresses host data for storage into cache memory, including the steps of comparing a storage capacity of compressed and uncompressed data within the logic as the compressed and uncompressed data loads into logic memory; and selecting either the uncompressed or compressed data for transfer to the cache memory based upon compression efficiency of the compressed data as compared to the uncompressed data.

In another aspect, the step of selecting includes the step of dynamically calculating compression efficiency in comparison to a linear function.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE DRAWINGS

Figure 2:
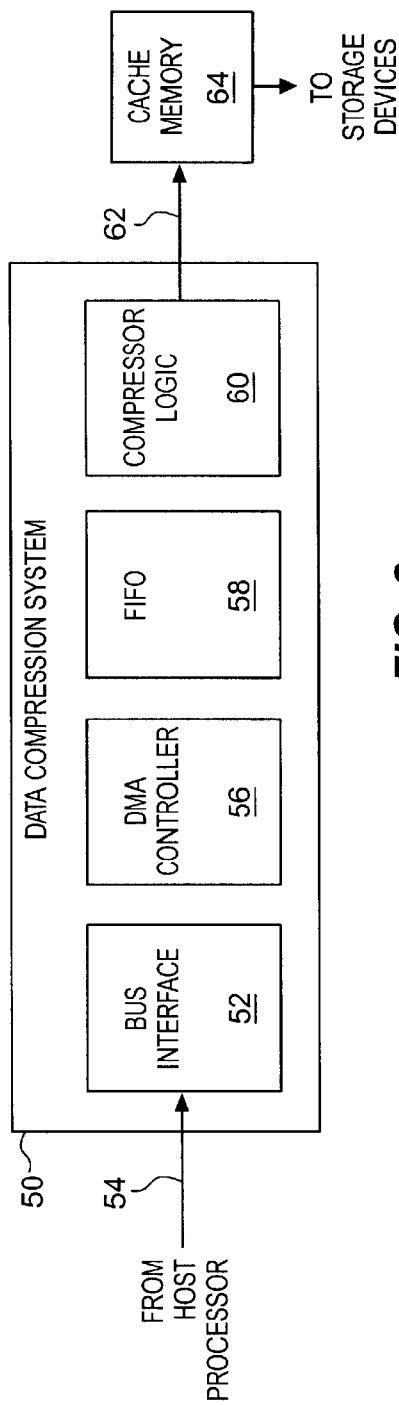
FIG. 2 shows a schematic illustration of a data compression system constructed according to the invention.

FIG. 2 schematically illustrates a data compression system 50 shown in block diagram form and constructed according to the invention. Bus interface 52 couples system 50 to data bus 54, which, for example, provides data to system 50 in a write operation from a host processor. Bus interface 52 can be, for example, an optical interface or optical transceiver which provides connectivity to a fiber optic link.

Section 56 reformats data from interface 52 into a suitable format for processing within compression system 50. Section 50 typically provides DMA-controller functionality, as labeled in FIG. 2.

FIFO section 58 provides data storage and buffering prior to actual data compression within compression logic 60, which preferably takes the form of an application specific integrated circuit (ASIC).

Compression logic 60 preferably provides on-chip compression and decompression. Prior art compression circuits include two ASICs, one for compression and one for decompression. The single ASIC of logic 60 enhances clock speeds and throughput through system 50, and thus provides obvious advantages over the prior art.

In operation, system 50 couples to a host processor (not shown) via data bus 54. Data bus 54 can for example be a serial fiber optic link with IBM's ESCON interface protocol. System 50 transforms data from bus 54 into compressed data, if possible, for transmission onto bus 62 and into cache memory 64. Cache memory 64 thereafter distributes the compressed data for storage within disk drives or within logical cylinders in a distributed redundancy group, as known in the art.

System 50 removes the bottlenecks associated with prior art data compression systems such as described above. Previously, as discussed in FIG. 1, data compression latency is compounded by the fact that data from the host arrives at a faster rate than data transmitted to cache memory. Accordingly, in selecting which RAM to drain, the other two RAMs are allocated to receive data from the host only after a decision is made (and all chunk bytes received)—resulting in latency. In accord with the invention, data compressability is evaluated during compression to predict which buffer (i.e., which Chunk RAM) should be drained prior to compressing the entire data chunk, i.e., all 512-bytes.

Figure 1:
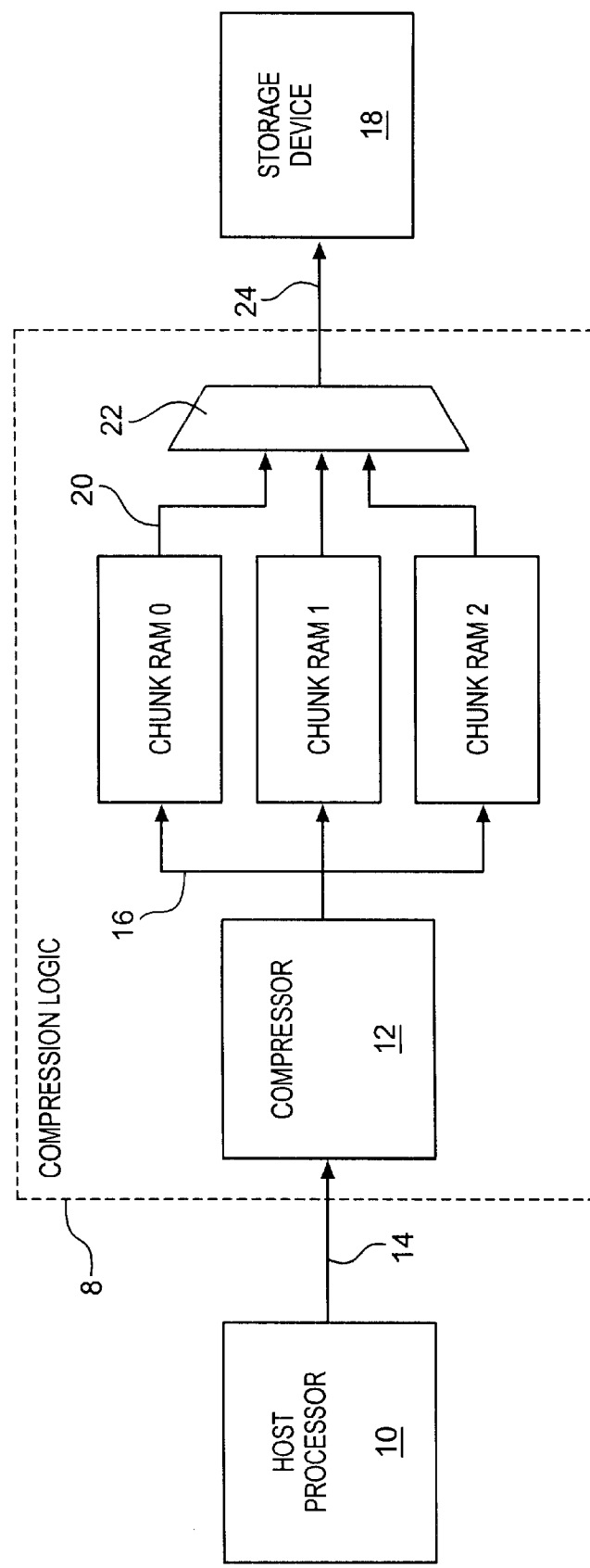
FIG. 1 schematically illustrates operation of prior art data compression logic as currently used by storage devices such as DASD systems.
Figure 3:
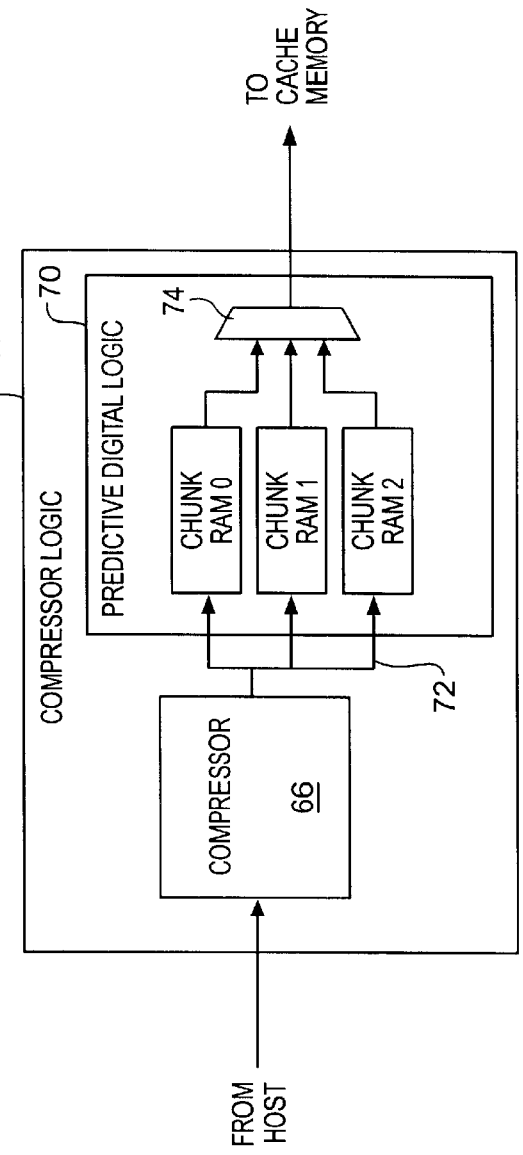
FIG. 3 shows further schematic detail of the digital compression logic of FIG. 2, in accord with the invention.

FIG. 3 illustrates further schematic detail of compression logic 60, FIG. 1. Host processor data are compressed by compressor 66 according to one of several known compression algorithms. For clarity of illustration, intervening components such as interfaces 52, 56 are not shown in FIG. 3.

Compressed data is sent to predictive digital logic section 70 via internal bus 72. Logic 70 includes three Chunk RAMs 0, 1, 2 such as described above; yet also monitors the extent to which the respective RAMs are filled, in order to evaluate compression efficiency. Prior to completing the compression and loading of compressed and uncompressed data within the two RAMs, logic 70 makes a decision as to which Chunk RAM to drain. Data compression latency is reduced by draining the selected Chunk RAM earlier than otherwise possible. Specifically, logic 70 accesses a pointer, relative to each Chunk RAM 0–2, which specifies the total number of bytes within the RAM; and logic 70 makes the decision to drain based upon predictive computations described in more detail below.

Once the Chunk RAM is selected, multiplexer 74 parses the preselected data from the associated RAM onto bus 62 for transmission to cache memory. All data goes through the cache memory for distribution into logical storage devices.

The decision to drain the selected Chunk RAM preferably derives from empirical or statistical data which can be accessed during compression and loading of the RAMs. By way of example, in the preferred embodiment, digital logic 70 makes a mathematical calculation, described below, to determine when to drain the appropriate RAM.

The method of minimizing the latency problem discussed above is referred herein as "predictive data compression." The methods of the invention predict whether the compressed or uncompressed data chunk will have fewer bytes without waiting for receipt of all bytes in the chunk, e.g. 512-bytes. Early determination of which chunk of data has fewer bytes allows for early RAM selection and the early transfer of data from that RAM.

The prediction process is facilitated by recognizing the maximum extent in which data may expand. In Advanced Data Compression algorithms, this case corresponds to when the data pattern has no repeating byte strings that are two bytes or longer. In such a case, all of the data is encoded as "literal" fields which required nine bits of information for every eight bit byte.

While compressed data and uncompressed data stream into the two allocated Chunk RAMs, a calculation is made by digital logic 70 as to how well the current data chunk is compressing. Early selection of the Chunk RAM can be made if, at some point in the loading of the RAMs, it is determined that the compressed chunk will be smaller even if all the remaining bytes of the transfer will expand to their maximum extent. One formula for making this assessment is:

$$\text{comp\_bytes} + 9/8(512 - n\text{comp\_bytes}) < 512 \quad (1)$$

where comp_bytes is the current number of bytes written to the compressed Chunk RAM and ncomp_bytes is the current number of bytes written to the uncompressed Chunk RAM. Taking ncomp_bytes away from 512 leaves the number of bytes of the current chunk of data still to be received from the host data path 54, FIG. 2. Multiplying that amount by 9/8 gives the maximum size attainable by fully expanded remaining bytes. Adding that figure to comp_bytes results in the maximum size that the chunk could be when the current chunk transfer completes. If and when that result becomes less than 512 (512 is the size of the final uncompressed chunk), the compressed chunk will ultimately be smaller and is therefore selected for transfer to the cache memory 64, and hence to the storage device.

Equation (1) may also be written in a form more compatible with digital logic, as shown as equation (2):

$$\text{comp\_bytes} + (512 - n\text{comp\_bytes}) + 1/8(512 - n\text{comp\_bytes}) < 512 \quad (2)$$

Figure 4:
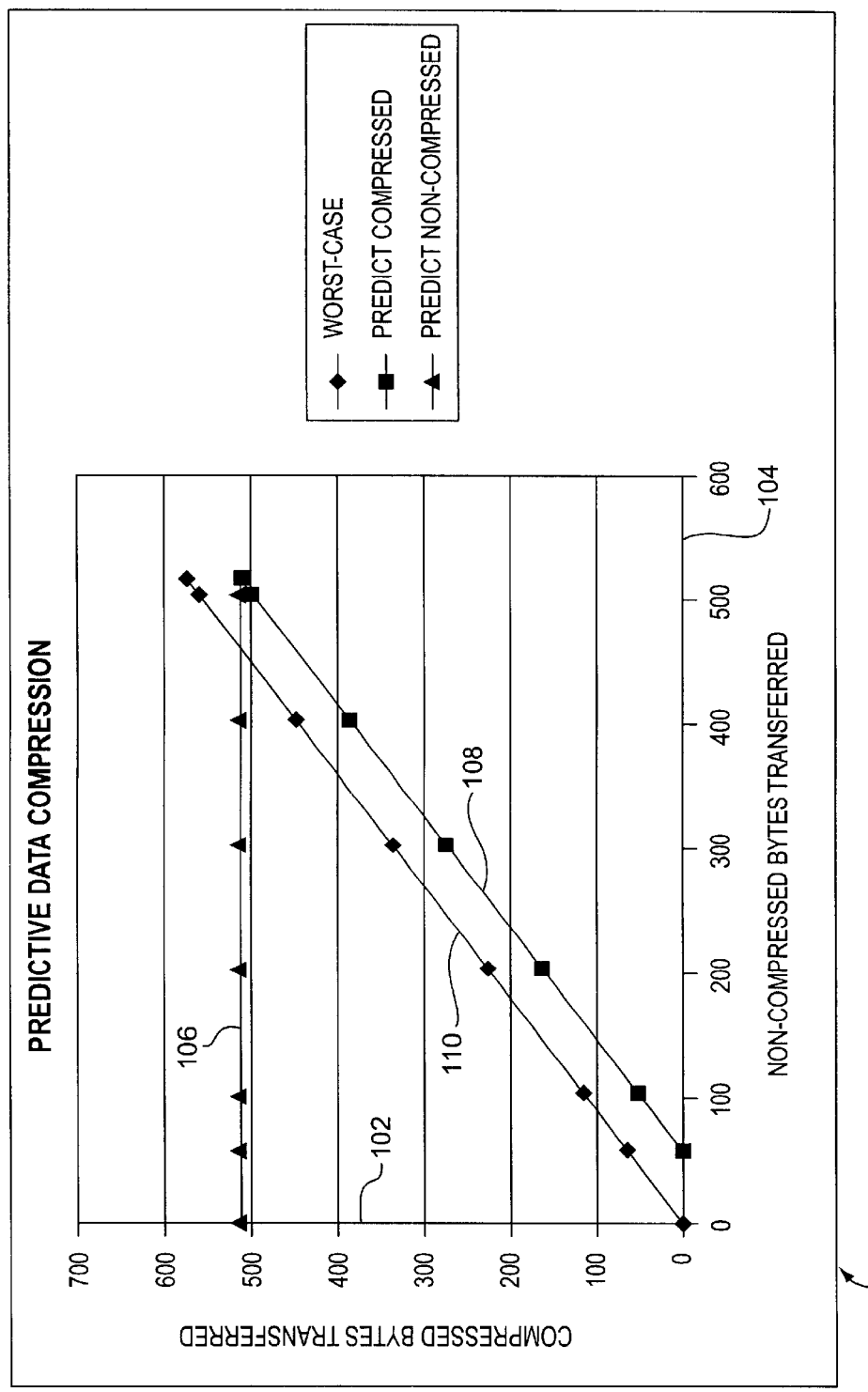
FIG. 4 shows a predictive compression curve suitable for use with the digital compression logic of FIG. 3 in selecting the appropriate Chunk RAM for transmission to cache memory.

A predictive data compression graph 100 of equation (2) is illustrated in FIG. 4, with the number of compressed bytes transferred representing the "y" axis 102 and the non-compressed bytes transferred representing the "x" axis 104. As shown, compressed data is selected to drain whenever the equation (2) relationship denotes a situation which is to the right of the predict compressed line 108. In a worst case scenario, denoted by line 110 (9/8*ncomp_bytes), compressed data will never expand so much as to be above line 110.

Note that if comp_bytes>512, as shown by the predict non-compressed line 106, early selection of the uncompressed Chunk RAM can be made by logic 70 because it will ultimately be smaller in length than the compressed chunk.

The point in time when the RAM-draining selection is made depends upon the particular data pattern under compression. More data redundancy early in the current chunk will satisfy the equation sooner, allowing for earlier Chunk RAM selection. Early selection reduces the latency of data passing through a Chunk RAM. It also reduces the probability that scenario (2), described above, will occur by draining data from the Chunk RAM sooner. That is, when the selected Chunk RAM is empty, it is made available for reallocation to receive the next data chunk from the host.

Predictive data compression according to the invention provides improved compression performance for host processor data compressed and written to a storage device. Simulation results on a large sample of 4K blocks of data indicate a reduced transfer time by about 7.5%. This alters the data transfer rate through the compression logic from an average of 17.7 M-bytes per second to 19.2 M-bytes per second with an ESCON link imposed limit of 19.6 M-bytes per second.

The invention thus attains the objects set forth above, among those apparent from preceding description. Since certain changes may be made in the above systems and methods without departing from the scope of the invention, it is intended that all matter contained in the above description or shown in the accompanying drawing be interpreted as illustrative and not in a limiting sense.

In view of the foregoing, what is claimed is:

1. Data compression logic for compressing data from a host to a connected storage device, comprising:
   a compressor for implementing a compression algorithm on the data;
   memory for storing compressed and uncompressed data chunks from the compressor; and
   predictive digital logic for assessing memory usage within the memory while uncompressed and compressed chunks are stored within the memory, the predictive digital logic draining either the uncompressed chunks or compressed chunks into the storage device based upon compression efficiency of the compressed data as compared to the uncompressed data and prior to complete loading of the chunks within the memory.

2. Data compression logic according to claim 1, wherein the memory comprises Chunk RAMs, one RAM storing the compressed data chunks and one RAM storing the uncompressed data chunks.

3. Data compression logic according to claim 2, wherein the Chunk RAMs comprise three chunk RAMs, two RAMs for storing data chunks while a third RAM drains into the storage device.

4. Data compression logic according to claim 2, further comprising a multiplexer for routing selected chunk data from one of the RAMs to the storage device.

5. Data compression logic according to claim 2, wherein the predictive digital logic comprises calculation logic for dynamically calculating compression efficiency in selecting one RAM for draining.

6. Data compression logic according to claim 5, wherein the calculation logic is constructed and arranged to dynamically calculate and compare compression efficiency as a linear function.

7. Data compression logic according to claim 2, wherein the predictive digital logic comprises means for selecting one Chunk RAM based upon the following equation, comp_bytes+9/8 (512−ncomp_bytes)<512, where comp_bytes corresponds to a current number of compressed data bytes written to a first Chunk RAM, and ncomp_bytes corresponds to a current number of uncompressed bytes written to a second Chunk RAM.

8. Data compression logic according to claim 2, wherein the predictive digital logic comprises means for selecting one Chunk RAM based upon the following equation, comp_bytes+(512−ncomp_bytes)+1/8 (512−ncomp_bytes)<512, where comp_bytes corresponds to a current number of compressed data bytes written to a first Chunk RAM, and ncomp_bytes corresponds to a current number of uncompressed bytes written to a second Chunk RAM.

9. A data compression system for compressing data from a host to a cache memory, comprising:
   a bus interface for coupling and communicating with a host bus connected to the host;
   a DMA controller for reformatting the data into data chunks;
   compressor logic for compressing the reformatted data and for storing and selecting compressed or uncompressed data chunks for transfer to the cache memory, the compressor logic having predictive digital logic for selecting, prior to compressing an entire data chunk, either the uncompressed or compressed data chunk to drain into the cache memory based upon compression efficiency of the compressed data chunk as compared to the uncompressed data chunk.

10. A data compression system according to claim 9, further comprising a FIFO for buffering reformatted data prior to compression by the compressor.

11. A method of predicting data compression for early draining of a data buffer within compression logic, the logic of the type which compresses host data for storage into cache memory, comprising the steps of:

comparing respective memory usage of compressed and uncompressed data within the logic as the compressed and uncompressed data loads into logic memory; and selecting either the uncompressed or compressed data for transfer to the cache memory based upon compression efficiency of the compressed data as compared to the uncompressed data.

12. A method according to claim 11, wherein the step of comparing further comprises the step of evaluating comp_bytes+9/8 (512−ncomp_bytes)<512, where comp_bytes corresponds to a current number of compressed data bytes within the memory, and ncomp_bytes corresponds to a current number of uncompressed bytes within memory.

13. A method according to claim 11, wherein the step of comparing further comprises the step of evaluating comp_bytes+(512−ncomp_bytes)+1/8 (512−ncomp_bytes) <512, where comp_bytes corresponds to a current number of compressed data bytes within the memory, and ncomp_bytes corresponds to a current number of uncompressed bytes within memory.

14. A method according to claim 11, wherein the step of selecting further comprises the step of dynamically calculating compression efficiency in comparison to a linear function.

* * * * *